(12) United States Patent
Christensen

(10) Patent No.: US 8,018,286 B2
(45) Date of Patent: Sep. 13, 2011

(54) LOW POWER INTEGRATED CIRCUIT

(75) Inventor: Kenn Christensen, Roskilde (DK)

(73) Assignee: Iptronics A/S, Roskilde (DK)

( * ) Notice: Subject to any disclaimer, the term of this patent is extended or adjusted under 35 U.S.C. 154(b) by 0 days.

(21) Appl. No.: 12/705,226

(22) Filed: Feb. 12, 2010

(65) Prior Publication Data

US 2010/0214019 A1 Aug. 26, 2010

Related U.S. Application Data

(60) Provisional application No. 61/167,713, filed on Apr. 8, 2009.

(30) Foreign Application Priority Data

Feb. 12, 2009 (DK) .................. 2009 00203

(51) Int. Cl.
 *H03F 3/04* (2006.01)
(52) U.S. Cl. .......................... 330/297; 330/307
(58) Field of Classification Search .......... 330/297, 330/124 R, 295, 307, 308
 See application file for complete search history.

(56) References Cited

U.S. PATENT DOCUMENTS

| 4,631,493 | A | 12/1986 | Vendelin et al. |
| 5,155,614 | A | 10/1992 | Carmen |
| 5,182,465 | A | 1/1993 | Stanley |
| 5,199,079 | A * | 3/1993 | Anderson et al. ............ 381/94.5 |
| 5,450,038 | A | 9/1995 | Rydel |
| 5,867,061 | A | 2/1999 | Rabjohn et al. |
| 6,970,152 | B1 * | 11/2005 | Bell et al. ...................... 345/100 |
| 7,042,295 | B2 | 5/2006 | Guckenerger et al. |
| 7,161,425 | B2 | 1/2007 | Hodgett et al. |
| 7,391,278 | B2 | 6/2008 | Berens |
| 2002/0113655 | A1 | 8/2002 | Lautzenhiser et al. |

FOREIGN PATENT DOCUMENTS

WO   WO 03/032396 A1   4/2003

OTHER PUBLICATIONS

Search Report issued Aug. 27, 2009 by the Danish Patent Office in DK PA 2009 00203.
Razavi, Behzad, "Differential TIAs", *Design of Integrated Circuits for Optical Communications*, 2003, pp. 100-102, McGraw-Hill, New York, USA.

* cited by examiner

*Primary Examiner* — Henry K Choe
(74) *Attorney, Agent, or Firm* — Buchanan Ingersoll & Rooney PC

(57) ABSTRACT

The present invention relates to an integrated electrical circuit in particular a receiver or driver suitable for broadband communication, such as optical interconnect. The circuit comprises two amplifiers which share current supply wherein the integrated circuit is arranged so that cross talk via this current supply is avoided over a large range of frequencies.

31 Claims, 7 Drawing Sheets

LOW POWER INTEGRATED CIRCUIT

TECHNICAL FIELD

The invention relates to the field of integrated circuitry wherein the integrated circuit comprises at least one first amplifier and at least one second amplifier each comprising an input signal port, an output signal port, an input supply port and an output supply port. The invention in particular relates to an integrated circuitry for optical communication in particular for optical interconnects such as integrated driver and receiver circuitry.

BACKGROUND ART

The demands for ever-increasing bandwidths in digital data communication equipment at reduced power consumption levels are constantly growing. These demands not only require more efficient integrated-circuit components, but also higher performance interconnects and devices. Indeed, as one example, the International Technology Roadmap for Semiconductors (ITRS) projects that high performance chips in the very near future will have operating frequencies, both on-chip and off-chip, rising above 50 GHz. Conventional metal-wire based interconnects have played a central role in the microelectronics revolution. It is apparent that wire-based interconnect devices will be challenged to enabling even higher operating frequencies.

However, besides challenges with regard to bandwidth, the wire-based interconnects of the future may struggle significantly with a high power consumption. The power requirement of electronic components typically increases with increased bandwidth, which in some cases results in increased cooling requirement which further increases power consumption of the electronic system. The power and cooling requirement may be particularly challenging to meet in data centers where larger quantities of servers are pooled and closely spaced. Such pooling inherently requires large quantities of interconnects which therefore may add significantly to the power and cooling requirements of the datacenter.

One approach to solve this problem includes utilizing optical interconnects as an alternative to wire-based interconnections as optical fibers have a significantly higher bandwidth relative to an electrical wire. It is therefore an object of the present invention to provide means for reducing the power requirement of an optical interconnect.

SUMMARY

An optical interconnect typically comprises a driver circuit which drives a light emitter (typically in a binary pattern), a waveguide (typically an optical fiber), and a receiver. A substantial amplification of the incoming signal is often required so that a substantial amount of power is required by the receiver. Furthermore, a substantial current and corresponding power is commonly required to drive a light emitter, such as a VCSEL. In an optical interconnect it is often an advantage to have the electrical elements in one end share a common voltage supply. In one embodiment this is performed by making a transceiver chip or a transceiver module with individual driver and receiver chips. The light emitter and/or photo detector often has specific voltage requirements to enable emission of light. These requirements may influence the voltage supply available to the driver and receiver circuitry (output stage as well as pre-amplifiers etc.) and the receiver circuitry. It is one object of the invention to provide low power circuits in particular for an optical interconnect, such as an integrated optical receiver or driver.

In one embodiment the invention relates to an integrated circuit having a signal input and a signal output said integrated circuit comprising at least one first amplifier and at least one second amplifier each comprising an input signal port, an output signal port, an input supply port and an output supply port where the output supply port of said first amplifier is connected to the input supply port of said second amplifier via a supply connection wherein said integrated circuit is arranged so that during normal operation a current $I_{A1,out}$ flows out of the output supply port of said first amplifier, a current $I_{A2,in}$ flows into the input supply port of said second amplifier and signal $S_{A1,out}$ on the output signal port of the first amplifier wherein $I_{A2,in}$ comprises at least part of $I_{A1,out}$ and $I_{A2,in}$ is substantially independent of variations of $S_{A1,out}$. In one embodiment $I_{A1,out}$ and/or $I_{A2,in}$ are substantially constant.

The circuit is arranged so that $I_{A2,in}$ is substantially independent of variations in $S_{A1,out}$ to avoid cross talk between the amplifiers within a wideband of frequencies so that the circuit will be suitable for e.g. digital communication in the Gigabit range. In one embodiment $S_{A2,out}$ on the output signal port of the second amplifier and $I_{A1,out}$ is substantially independent of variations in $S_{A2,out}$. In one embodiment the amplifiers will be in the same signal path so the signal from the output signal port from one amplifier will affect the input signal port of the other. In one such embodiment dependence between $S_{A2,out}$ and $I_{A1,out}$ will likely also impose dependence between $S_{A1,out}$ and $I_{A2,in}$. In the invention the independence is obtained by ensuring that the currents $I_{A1,out}$ and $I_{A2,in}$ does not serve as a channel for carrying cross talk between the amplifiers. In other words $I_{A2,in}$ is in one embodiment substantially independent of variations in $I_{A1,out}$. The circuit may in one embodiment be arranged so that $I_{A1,out}=I_{A2,in}$ where that circuit is arranged so the both $I_{A1,out}$ and $I_{A2,in}$ are substantially jitter free which is equivalent to substantially independent in terms of cross talk. The jitter is therefore to be suppressed corresponding to suppression of the dependence. Throughout the remaining text the characterization that $I_{A1,out}$ and $I_{A2,in}$ are independent is used interchangeably with $I_{A2,in}$ is substantially independent of variations in $S_{A1,out}$ (and vice versa) and/or $I_{A1,out}$ is substantially independent of variations in $S_{A2,out}$.

In other technical fields prior art comprises examples of amplifiers connected so that their power supply is connected in series between supply voltages. One such example is U.S. Pat. No. 5,450,038. In this patent, as well as in other examples, the currents corresponding to $I_{A2,in}$ and $I_{A1,out}$ are either not substantially independent or only substantially independent with a relatively narrow frequency band. To achieve decoupling within a band of frequencies one or more capacitors and/or coils are applied. Such circuits are likely not suitable for high speed binary communication and other types of communication which require a wide band of frequencies. Coils are often not available to the integrated circuit designer and to achieve sufficient decoupling to obtain decoupling for a large frequency span a capacitor will have to be very large which would be prohibitive to a compact integrated design. Furthermore such as a capacitor, or an equivalent formed by active components, may introduce a significant amount of noise.

Depending on the application the requirement of "substantially independent" may be relaxed for frequencies higher than the system is arranged to receive. In one embodiment such a relaxation may occur when components, such as a transistor, are not within their operational range. As the circuit may be applied to very wide band signals the circuit is in one embodiment arranged so that independence between the supply currents is obtained well below the center frequency $f_c$ of the signal such as frequencies less than $f_c/2$, such as frequencies less than $f_c/10$, such as frequencies less than $f_c/25$, such as frequencies less than $f_c/50$, such as frequencies less than $f_c/100$, such as frequencies less than $f_c/500$, such as frequencies less than $f_c/1000$, such as frequencies less than $f_c/5000$, such as frequencies less than $f_c/10^4$, such as frequencies less than $f_c/10^5$, such as frequencies less than $f_c/10^6$, such as frequencies less than $f_c/10^7$, such as frequencies less than $f_c/10^8$, such as frequencies less than $f_c/10^9$, such as frequencies less than file, such as to DC i.e. substantially 0 Hz. In one embodiment substantially independent is obtained for frequencies less than 10 GHz, such as less than 1 GHz, such as less than 500 MHz, such as less than 100 MHz, such as less than 500 kHz, such as less than 100 kHz, such as less than 50 kHz, such as less than 10 kHz, such as less than 1 kHz, such as less than 500 Hz, such as less than 250 Hz, such as less than 100 Hz, such as less than 50 Hz, such as less than 25 Hz, such as less than 10 Hz, such as less than 1 Hz, such as less than 0.1 Hz. In one embodiment substantially independent is obtained least for frequencies higher than 1 Hz, such as higher than 10 Hz, such as higher than 10 Hz, such as higher than 10 Hz, such as higher than 10 Hz, such as higher than 10 Hz, such as higher than 50 Hz, such as higher than 100 Hz, such as higher than 1 kHz, such as higher than 10 kHz, such as higher than 50 kHz, such as higher than 100 kHz, such as higher than 500 kHz, such as higher than 1 MHz, such as higher than 10 MHz, such as higher than 50 MHz, such as higher than 500 MHz, such as higher than 1 GHz, such as higher than 10 GHz.

In one embodiment of the invention the first and second amplifiers are isolated so that one or more of the signal ports of said first amplifier, such as both the signal input and the signal output, ports refers to the positive supply whereas one or more, such as all, of the signal ports of said second amplifier refers to ground. In this context said referring to the positive and/or negative supply may or may not be frequency dependent. In case of the latter the isolation may be within one or more of the frequency intervals discussed above.

In one embodiment of the invention the circuit is arranged so that the current $I_{A2,in}$ and/or $I_{A1,out}$ is/are substantially independent of the supply voltage. The latter may be dependent upon criteria such as sufficient headroom is supplied and no damage thresholds are surpassed. One example where the currents are independent of the supply voltage is when a current source is placed between the output supply port of the first amplifier and the input supply of the second amplifier. In another example a voltage stabilizer such as a Zener Diode, a diode, or an active diode ensures that current into the input supply port of the second amplifier is isolated.

In one embodiment the invention relates to an integrated circuit having a signal input and a signal output said integrated circuit comprising at least one first amplifier and at least one second amplifier each comprising an input signal port, an output signal port, an input supply port and an output supply port where the output supply port of said first amplifier is connected to the input supply port of said second amplifier wherein said first amplifier is a differential amplifier comprising at least one current source and said integrated circuit is arranged so that during normal operation the integrated circuit has a high impedance into the output supply port of the first amplifier. In one embodiment high impedance refers to impedance that is high relative to impedances in the signal path. In this context relatively high may be taken to be more than or equal to a factor 1.5 of the impedances of the signal path, such as more than or equal to a factor 2, such as more than or equal to a factor 10, such as more than or equal to a factor 50, such as more than or equal to a factor 100, such as more than or equal to a factor 250, such as more than or equal to a factor 500, such as more than or equal to a factor 1000, such as more than or equal to a factor 2000, such as more than or equal to a factor 5000, such as more than or equal to a factor 10000, such as more than or equal to a factor 100000, such as more than or equal to a factor 1000000. In one embodiment a high impedance refers to an impedance of more than or equal to 1 kΩ, such as more than or equal to 20 kΩ, such as more than or equal to 40 kΩ, such as more than or equal to 80 kΩ such as more than or equal to 100 kΩ, such as more than or equal to 150 kΩ, such as more than or equal to 200 kΩ, such as more than or equal to 500 kΩ, such as more than or equal to 1MΩ, such as more than or equal to 10MΩ. In one embodiment the high impedance is higher than the impedance of the circuit "seen" out of the output supply port of the first amplifier. In one embodiment "higher then the impedance" refers to higher by a factor higher than or equal to 1.1, such as than or equal to a factor of 2, such as than or equal to a factor of 3, such as than or equal to a factor of 4, such as than or equal to a factor of 5, such as than or equal to a factor of 10, such as than or equal to a factor of 20, such as than or equal to a factor of 50, such as than or equal to a factor of 100.

In the invention the current supplied to the first amplifier may be reused by the second amplifier with little or no cross talk between the amplifiers via the current supply over a wide band of frequencies. Isolation over a wide band of frequencies is required by some applications, such as high speed digital communication. The invention may provide a reduction in the power consumption of the circuit at least when the available supply is larger than the headroom required by the amplifiers of the circuit. This is sometimes the case when only a single power supply voltage is available and one or more components require a relatively high voltage. An example of such a component is a PIN diode. Other constraints may impose the use of a relatively high voltage such as system- or communications standards.

Often the receiver of an optical interconnect comprises a transimpedance amplifier arranged to receive the signal from a detector, such as a photodiode. In such a configuration it may be advantageous to supply a relatively high current to the transimpedance amplifier in order to reduce thermal noise. In one embodiment it is therefore an advantage that substantially all current in the supply connection is routed through the supply ports of the transimpedance amplifier. In one embodiment the transimpedance amplifier is the first amplifier along the signal path. In one embodiment the transimpedance amplifier is arranged as said second amplifier as this may provide convenient connection to a photodiode. By the invention this current is advantageously reused providing a reduction in overall power consumption of the circuit.

In this context the term "supply connection" refers to a connection, which in one embodiment may be a conductor and in one embodiment may comprise one or more components. The term power path designates the combined supply connections along which current flows from the positive supply to negative supply or ground. In one embodiment the power path may branch, such as by having the supply of one or more components in parallel.

In the present context the term "normal operation" refers to the integrated circuit performing the main operation, such as a receiver receiving and a driver driving, but not necessarily including periods of operation such as initialization, resetting, error state, error reporting or the like. In one embodiment normal operation is taken to be an operation mode functioning more than 10% of the time the integrated circuit is on (i.e. supplied a current and/or voltage), such as more than 20%, such as more than 30%, such as more than 40%, such as more than 50%, such as more than 60%, such as more than 70%, such as more than 80%, such as more than 90%, such as more than 95%, such as more than 99%. In one embodiment the phrase "in use" is synonymous with normal operation and in one embodiment the phrase "in use" refers to the integrated circuit being on.

In one embodiment of the invention substantially constant current refers to a current constant to within 20%, such as within 10%, such as within 5%, such as within 2%, such as within 1%, such as within 0.5%, such as within 0.1%, such as within 0.01%. In one embodiment $I_2$ substantially independent of variations in $I_1$ is taken to mean that less than 50% of a variation found in $I_1$ may be found in $I_2$, such as less than 20%, such as less than 10%, such as less than 1%, such as less than 0.1%, such as less than 0.01%. In one embodiment the phrase "$I_2$ substantially independent of variations in $I_i$" is taken to mean at any frequency included in the operating range of the integrated circuit and/or any of the frequency intervals provided above.

In one embodiment of the invention substantially constant current refers to a constant current unaffected by signal input of the integrated circuit. In one embodiment of the invention substantially constant current refers to a constant current unaffected by the DC value or average value of the signal input of the integrated circuit.

In one embodiment the invention relates to a receiver and/or driver system comprising an integrated circuit according to the invention and a photo detector and/or light emitter connected to said integrated circuit. In one embodiment the integrated circuit is integrated on a die. Such a die may in one embodiment comprise multiple receiver circuit which may enable the reception of multiple data channels in parallel. In an embodiment the die further comprises one or more driver circuits. In this way the die may function as a transceiver. In particular said driver circuit(s) may be arranged to drive a light emitter such as a VCSEL or a photodiode. In one embodiment the photo detector is integrated on the die along with a receiver circuit. In one embodiment of the system said driver and/or receiver circuit is integrated on a die, said die comprising multiple driver and/or receiver circuits. In this way a single die may function to send and/or receive in multiple channels. On such a die coupling of cross talk via the voltage supply is of particular importance. In one embodiment of the present invention stability provided by having stabilized the currents between the amplifiers provides good cross-talk isolation to the supply.

In one embodiment the supply connection connecting the first and second amplifiers comprises a current source. This current source will provide an isolation of the first and second amplifiers so cross talk between the first and the second amplifier due to variations in current consumption of the first and/or second amplifier is reduced or avoided. In the context of the present invention a current source is, unless otherwise specified, taken to mean a substantially constant current source. The meaning of the term "substantially" in this context is discussed below.

In principle a current source may be any circuit construction suitable for providing a substantially constant current through the sources. In one embodiment one or more current source(s) of the integrated circuit comprises a current mirror.

In one embodiment the current supplied to the second amplifier is substantially identical to the current supplied to said first amplifier. In one embodiment the current supplied to the second amplifier is a substantially constant percentage of the current supplied to the first amplifier.

In one embodiment the supply ports of the first and second amplifiers form at least part of a serial connection from positive supply to negative supply or ground. In one embodiment a substantial constant power and/or current supplied to said serial connection provides an advantage in avoiding cross talk coupled to other components via a common supply, negative and/or ground, particularly other components integrated along with the integrated circuit. In one embodiment such other components are one or more receiver circuits and/or driver circuits, such as in multichannel system where the system or chip comprising the integrated circuit of the invention is capable of receiving multiple channels. In one such system the one or more of said receiver and/or driver circuits comprise a circuit according to the invention. Having good isolation between receiver circuits and/or driver circuits may in many embodiments provide a significant advantage as such cross talk may contribute significantly to inter channel crosstalk.

In one embodiment the first and/or second amplifier comprises a current source arranged to control the current into the input supply port and/or the current out of the output supply port. Similarly to a current source comprised in the supply connection, a current source comprised in one of the amplifiers may provide isolation between the first and second amplifiers.

In one embodiment the output signal port of the first amplifier is connected to the input signal port of the second amplifier via an electrical signal connection, so that the second amplifier is arranged to amplify the output of the first amplifier.

In one embodiment the input port of the first amplifier is not connected to the output port of the second amplifier. Similarly to the supply connection, the electrical signal connection may be a conductor but may also comprise one or more components. The term "electrical signal path", or just signal path, designates the combined electrical signal connections along which signal current or signal potential travel from the input port of the integrated circuit to the output port of the integrated circuit. In one embodiment the output signal port of the second amplifier is connected to the input signal port of the first amplifier via an electrical signal connection, so that the first amplifier is arranged to amplify the output of the second amplifier. In one embodiment the input port of the second amplifier is not connected to the output port of the first amplifier. In one embodiment the integrated circuit has more than one signal path and in one embodiment more than one signal input and/or more than one signal output. In one embodiment said signal paths do not meet so that signal flowing along said path may be uncorrelated. In one embodiment signal is combined and/or divided along the signal path and therefore the number of signal inputs may not correspond to the number of signal outputs. Generally the term "signal path" will refer to all of the signal paths of the integrated circuit. In one embodiment the term "signal path" refers to any signal path which is amplified or otherwise processed by the first and/or second amplifiers. In one embodiment the two signal paths will be arranged to carry different signal types, e.g. with different amplitude, bandwidth or similar. In such a case a discussion of features of the integrated circuit, such as the magnitude of a resistor, in relation to the signal or the signal path will refer to the signal path interacting with that part of the circuit comprising the feature.

In the context of the present invention the term "amplify" is not necessarily limited to amplification as such but refers to a function performable by an amplifier. This includes, but is not limited to that in one embodiment the first and/or second amplifier is arranged to increase the signal amplitude. In one embodiment the first and/or second amplifier is arranged to reduce the signal amplitude. In one embodiment the first and/or second amplifier is arranged to function as a limiting amplifier.

In one embodiment said first and/or said second amplifier is arranged to hold a substantially constant current in at least one supply port. In one such embodiment the said supply port is arranged to function substantially as a current source. In one embodiment amplifier comprises a current source. In one embodiment said current source is connected to the output supply port. In one embodiment said current source is connected to the output supply port of said first and/or second amplifier. In one embodiment said current source is connected to the input supply port of said first and/or second amplifier In one embodiment substantially constant current in at least on supply port is obtained by designing the amplifier so that the current consumption of said amplifier is substantially constant at least for signals within the range for which the integrated circuit is designed and/or is sufficiently constant for the application at hand. In one embodiment the amplifier is designed to amplify a differential input to a differential output. In one embodiment such an amplifier has a substantially constant current consumption as a high input in one side of the differential input is mirrored by low input on the other side of the differential input. This may be particularly true for binary signals. In one embodiment the amplifier is constructed to comprise a current source which stabilizes the current flow of at least one supply port. In one embodiment this current source is connected to the output supply port of the amplifier. Absent such a current source, the differential amplifier may introduce some jitter in one or both of the supply ports when the signal changes abruptly, such as from 0 to 1 in a binary signal. The ability of current source to suppress this jitter is depends in one embodiment on how well the component(s) forming the current source are able to form a current source. Substantial ideality is in one embodiment likely achieved within a frequency interval. In one application less, or close to no, suppression of said jitter current is acceptable so that the current source may in one embodiment be replaced by a resistor. In one embodiment said current source stabilizes and/or controls current flow from the input supply port to the output supply port.

In one embodiment said first and/or said second amplifier have a differential input and/or output. Relative to an amplifier with single ended input and/or output an amplifier with a differential input is likely to have a more constant power/current consumption and therefore couple less ripple to the supply and/or ground. In one embodiment such an amplifier causes some ripple, in the supply and/or ground, in the form of spikes when the signal changes abruptly such as a change from one binary state to the other. However, in one embodiment such spikes consist primarily of frequency components which experience relatively high loss when travelling along the conductors providing positive, negative, or ground potentials which may form a link between the integrated circuit and said other components. Accordingly, such spikes may be less critical in coupling of cross talk relative to ripple comprising more low frequency components.

In one embodiment said first and/or said second amplifier have a single ended input and/or output. Such amplifiers may be better suited to perform some functions relative to an amplifier with a differential input and/or output. In one embodiment a single ended amplifier has better noise performance relative to a similar differential amplifier often at least with respect to thermal noise. Accordingly, in one embodiment it is an advantage to have the first amplifier along the signal path as a single ended amplifier as this allows low noise amplification of the signal, which after a first amplification may be less sensitive to added noise such as noise added by a subsequent amplifier, such as a differential amplifier. In an optical receiver the first amplifier is often a transimpedance amplifier. Note that the first amplifier along the signal path may be any of the amplifiers as defined by claim 1 such as the first or the second amplifier. In one embodiment the input of the integrated circuit is single ended whereas the output of the integrated circuit is differential. In one embodiment the integrated circuit comprises a conversion from a single ended signal to a differential signal. Several techniques for this conversion exist in the art, such as those discussed in Behzad Razavi, "Design of Integrated Circuits for Optical Communications", McGraw-Hill, New York, USA (2003), ISBN 0-07-282258-9 section 4.5 (hereinafter referred to as Razavi). In one embodiment the conversion is performed by using the single ended signal as input to one side of a differential stage or differential amplifier and a DC voltage is used as input to the other side of said differential amplifier. In one embodiment said differential amplifier is or forms part of one of the amplifiers of claim 1. With the correct DC value, the output of the differential amplifier will be a differential version of the single ended signal. In one embodiment the correct DC value is the average value of the single ended signal. In one embodiment this DC value is obtained via an RC-filter (resistor and capacitor in series). An example of such a design is shown in FIG. 4.36 of Razavi. In one embodiment it is advantageous that the RC time constant of the filter is large so that broadband of signals pass through to the output of the differential amplifier. This may be accomplished by having a larger resistor and/or a large capacitor. For an integrated circuit a resistor is often more compact than a capacitor and it may therefore be preferred to have a large resistor for such circuits. In some arts of electronics obtaining a DC value from a signal is referred to as DC restore. This refers to the original signal transmitted with reference to a DC value, received by a single ended receiver input and the DC value is subsequently recovered. In one embodiment invention DC restore refers to obtaining the DC value suitable for obtaining a substantially symmetric differential signal. In one embodiment obtaining the DC value from the single ended signal is achieved via what may be referred to as feed-forward DC restore. In one embodiment what may be referred to as feed-back DC restore is applied instead or in combination with feed-forward DC recovery. In a feed-back DC restore the integrated circuit is arranged to sense whether the output of the integrated circuit is a substantially symmetric differential signal and one or more deviations from this is used as feedback in order to adjust the DC value accordingly. In one such embodiment the DC values of each side of the differential output of the integrated circuit is obtained, such as by two RC filters, and subsequently compared. The difference is then fed back to the integrated circuit for example via en op-amp. In this way a substantially symmetric differential output may be obtained even if non-idealities of the integrated circuit would otherwise have caused non-symmetry if a feed-forward DC restore was implemented instead.

In one embodiment the first and/or second amplifier is a transimpedance amplifier such as a transimpedance amplifier suitable for amplifying current input from a photo detector. In one embodiment this transimpedance amplifier has a single ended input. In one embodiment this is an advantage as the component providing signal to this amplifier, such as a photodiode, provides a single ended signal. In one embodiment this transimpedance amplifier has a single ended output. In one embodiment this transimpedance amplifier has a differential input and/or output. In one embodiment the circuit is arranged so that the transimpedance amplifier functions in its linear regime for all signals for which the circuit is arranged to function. In one embodiment this corresponds to feeding sufficient current to the transimpedance amplifier.

In one embodiment a voltage stabilizer is connected in parallel with said first and/or said second amplifier. In this context the term "voltage stabilizer" refers to a component, or a set of connected components, suitable for maintaining a substantially constant voltage at least within an interval of frequencies such as the frequencies for which the integrated circuit is designed. By maintaining a fixed voltage over one or both of the first and second amplifiers an increased de-coupling of the supply ports of the amplifier may in one embodiment be provided, causing an improvement in cross-talk performance. In one embodiment a voltage stabilizer is applied as an alternative to having a current source in or between the amplifiers. The challenge for such a device may be to achieve sufficient decoupling over the required bandwidth. In one embodiment a Zener diode or an equivalent is applied. Furthermore, in one embodiment current may be channeled to or from the voltage stabilizer so peak current or surplus may be guided through the voltage stabilizer. In one embodiment the voltage stabilizer is constructed from passive electrical components such as inductors, resistors and capacitors. In one embodiment the voltage stabilizer is a passive filter comprising at least one capacitive load and/or inductive load. In one embodiment the voltage stabilizer further comprises a resistive load.

In one embodiment the voltage stabilizer is implemented at least partly to compensate for one or more imperfections of a current source relative to an ideal current source. In one embodiment said current source is one or more of: the group of a current source comprised in the first amplifier, a current source comprised in the second amplifier and a current source located on the supply connection. Such imperfections may be one or more of inductive coupling, bandwidth limitations and parasitic capacitances. In one embodiment such imperfections affects the performance by providing a way for cross talk between the first and second amplifiers at higher frequencies. Such cross talk may be within the tolerable variances discussed with regard to the term "substantial constant", such as being the primary source of said variance. In one embodiment the voltage stabilizer at least partly shield the first and/or second amplifier from said variance on the substantially constant current. In one embodiment the parasitic capacitance dominates the performance of the current source above an upper cut-off frequency. In one embodiment said cut-off frequency is above the designed operational bandwidth of the integrated circuit.

In one embodiment the voltage stabilizer comprises a capacitive load, such as a capacitor in parallel with the first and/or second amplifier. In one embodiment said capacitive load has substantially smaller impedance relative to the impedance of the imperfections of the current source. In one embodiment the (modulus of) the impedance of the imperfection(s) is at least a factor 10 higher than the capacitive load, such as at least a factor 100 higher than the capacitive load, such as at least a factor 500 higher than the capacitive load, such as at least a factor 1000 higher than the capacitive load, such as at least a factor 5000 higher than the capacitive load, such as at least a factor 10000 higher than the capacitive load. It should be noted that providing a capacitive load with low impedance corresponds to providing a high capacitance which traditionally corresponds to providing a physically large capacitor. However, in an integrated design space may not be available or may be related to a high cost due to the required chip area. In one embodiment the capacitor therefore take up an area less than corresponding to 1 mm by 1 mm, such as an area less than corresponding to 0.5 mm by 0.5 mm, such as an area less than corresponding to 0.25 mm by 0.25 mm, such as an area less than corresponding to 0.15 mm by 0.15 mm, such as an area less than corresponding to 0.1 mm by 0.1 mm, such as an area less than corresponding to 0.05 mm by 0.05 mm, such as an area less than corresponding to 0.01 mm by 0.01 mm. In one embodiment it is an advantage of the invention that the only a relatively small capacitor is required to efficiently shield an amplifier as the substantially constant current is sufficiently constant for most frequencies such as from DC to up to an upper frequency while imperfections are sufficiently dominated by a relatively small capacitor at higher frequencies.

In one embodiment the voltage stabilizer comprises an inductive load. In one embodiment the voltage stabilizer comprises one or more active components such as a Zener diode or operational amplifiers. An example of such a voltage stabilizer is a Zener diode connected in parallel with the second amplifier. In this way the diode may ensure that a specific voltage is maintain across the second amplifier and conduct excess current if required. Obviously, there are an extensive number of possible designs with a similar or equivalent functionality such as applying an active diode circuit instead of a Zener diode. In one embodiment the voltage stabilizer feedback loop is arranged so that the voltage is stabilized relative to a voltage reference.

In one embodiment the first and/or second amplifier comprises a series of two or more cascaded amplifiers. These cascaded amplifiers are connected in series along the signal path whereas the supply ports of the cascaded amplifiers are connected in parallel. In one embodiment all amplifiers have a substantially equal amplification factor and in one embodiment the amplification of two or more amplifiers of the set is different. In one embodiment the amplifiers of the set have an increasing amplification factor along the signal path in the direction from input to output of the integrated circuit. In one embodiment cascading provides an improved noise figure relative to a single amplifier. In one embodiment cascading of one amplifier allows the designer to tune the current consumption of that amplifier e.g. to match the current consumption to that of the other amplifier.

In one embodiment the first amplifier is arranged to have a higher current consumption than the second amplifier i.e. a higher current exiting from the output supply port of the first amplifier than entering the input supply port of the second amplifier the difference referred to as excess current. In one embodiment the integrated circuit comprises a drain path arranged to pass at least part of the excess current around the second amplifier. In one embodiment the second amplifier is arranged to have a higher current consumption than the first amplifier i.e. a higher current entering the input supply port of the second amplifier than exiting the output supply port of the second amplifier the difference referred to as added current. In one embodiment the integrated circuit comprises an added current path arranged to pass at least part of the added current to the second amplifier. In one embodiment the added path comprises a current source.

In one embodiment the integrated circuit is arranged to comprise a regulator circuit arranged to adjust the current into the input supply port of the second amplifier. In one embodiment said regulator is a programmable circuit so that the current added or subtracted may be set by programming. In one embodiment the said regulator regulates relative to a reference, such as a current and/or a voltage reference. In one embodiment said regulator functions as a voltage stabilizer such as discussed above.

In one embodiment the inherent current consumption of the first amplifier in use is substantially matched to the inherent current consumption of the second amplifier in use.

In one embodiment the integrated circuit comprises N amplifiers, where N is an integer larger than 1, each amplifier comprising an input signal port, an output signal port, an input supply port and an output supply port wherein the supply ports of said amplifiers are connected in series via a supply connection wherein said integrated circuit is arranged so that two or more of the amplifiers are decoupled in a similar manner to first and second amplifiers. In this way the invention is not limited to the first and second amplifiers sharing supply current but may comprise three or more amplifiers sharing supply current. In one embodiment one or more of said N amplifiers are formed by a set of cascaded amplifiers.

In one embodiment the integrated circuit is arranged to receive signals over a bandwidth larger than or equal to 500 MHz, such as larger than or equal to 1 GHz, such as larger than or equal to 2 GHz, such as larger than or equal to 5 GHz, such as larger than or equal to 10 GHz, such as larger than or equal to 15 GHz, such as larger than or equal to 20 GHz, such as larger than or equal to 35 GHz, such as larger than or equal to 50 GHz, such as larger than or equal to 100 GHz. In one embodiment the term "substantially constant" is taken to mean substantially constant over a bandwidth larger than 500 MHz, such as larger than 1 GHz, such as larger than 2 GHz, such as larger than 5 GHz, such as larger than 10 GHz, such as larger than 15 GHz, such as larger than 20 GHz, such as larger than 35 GHz, such as larger than 50 GHz, such as larger than 100 GHz. In one embodiment said bandwidth ranges from DC or a frequency higher than or equal to 1 kHz, such as higher than or equal to 10 kHz, such as higher than or equal to 50 kHz, such as higher than or equal to 100 kHz, such as higher than or equal to 500 kHz, such as higher than or equal to 1 GHz. In one embodiment the integrated circuit is suitable for receiving binary signals at a data-rate of 500 Mbit or more, such as 1 Gigabit or more, such as 5 Gigabit or more, such as 10 Gigabit or more, such as 20 Gigabit or more. In one embodiment DC is substantially 0 Hz. In one embodiment DC refers to the circuit carrying a DC value from the signal input to the signal output.

In one embodiment the integrated circuit is a receiver circuit. In one embodiment the integrated circuit is suitable for receiving a signal from a photo detector, such as a photodiode or a phototransistor. In one embodiment said integrated circuit is arranged to provide a bias current and/or bias voltage to said photo detector. In one embodiment the receiver circuit is suitable for forming part of an optical interconnect system comprising a transmitter, a receiver comprising the receiver circuit and a communication channel, such as an optical fiber. In one embodiment the receiver circuit forms part of a transceiver such as a transceiver integrated on a single die comprising at least one driver circuit and at least one receiver circuit. In one embodiment said driver is suitable for driving a light emitter, such as a photodiode or a VCSEL.

In one embodiment the integrated circuit is a driver circuit. In one embodiment the integrated circuit is arranged to drive a light emitter. In one embodiment said light emitter is selected from the group of a laser diode, a light emitting diode a VCSEL diode and a Mach Zender modulator. In one embodiment the integrated circuit is suitable for receiving a signal from a photo detector, such as a photodiode or a phototransistor. In one embodiment said integrated circuit is arranged to provide a bias current and a modulation current to said light emitter. In one embodiment the integrated circuit is suitable for forming part of an optical interconnect system comprising a transmitter, a receiver comprising the receiver circuit and a communication channel, such as an optical fiber. In one embodiment the driver circuit forms part of a transceiver such as a transceiver integrated on a single die comprising at least one driver circuit and at least one receiver circuit. In one embodiment the invention is applied to a driver circuit where said first and/or second amplifier provides equalization such as pre-emphasis and de-emphasis.

BRIEF DESCRIPTION OF DRAWINGS

The invention will be explained more fully below in connection with a preferred embodiment and with reference to the drawings in which.

The figures are schematic and may be simplified for clarity. Throughout, the same reference numerals are used for identical or corresponding parts.

Further scope of applicability of the present invention will become apparent from the detailed description given hereinafter. However, it should be understood that the detailed description and specific examples, while indicating embodiments of the invention, are given by way of illustration only, since various changes and modifications within the spirit and scope of the invention will become apparent to those skilled in the art from this detailed description.

PREFERRED EMBODIMENTS

Figure 1:
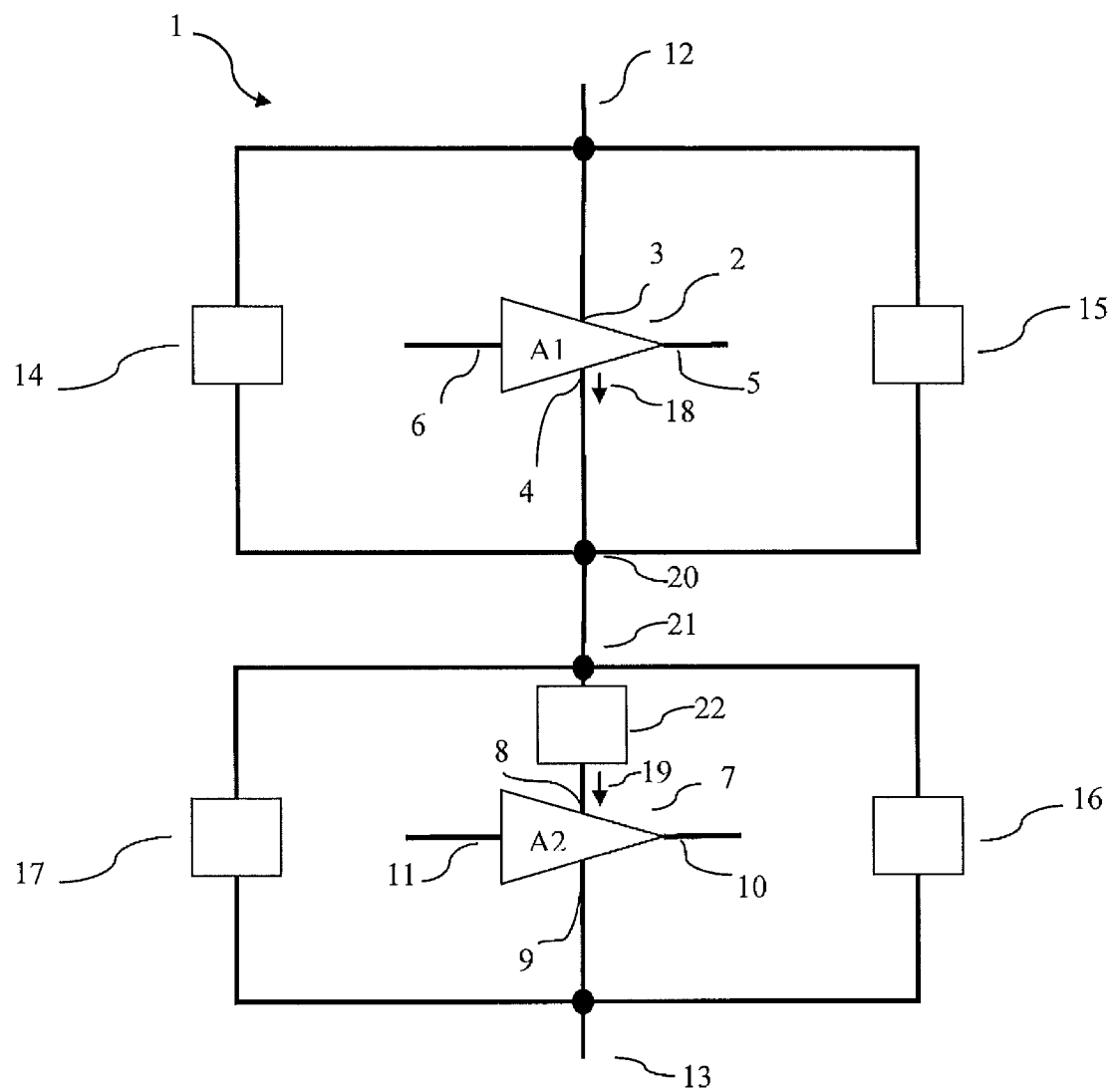
FIG. 1 shows a schematic drawing of a circuit according to the invention.

In FIG. 1 the first amplifier 2 has a signal input 6, a signal output 5, an input supply port 3 and an output supply port 4. Similarly the second amplifier 7 has a signal input 11, a signal output 10, an input supply port 8 and an output supply port 9. The supply ports of the amplifiers are arranged to be supplied from the positive supply 12 and the negative supply 13. In the current example, as well as this text as a whole, positive and negative supply need not necessarily be supplies as such but in principle indicates a difference in potential in the positive supply relative to the negative supply suitable for supplying the necessary current and/or headroom to the circuit, often preferably sufficiently constant to provide a substantial constant performance of the first and second amplifiers. Accordingly, in one embodiment the circuit is implemented between a positive supply and ground. In one embodiment the circuit is implemented with additional circuitry above the indicated positive supply and/or with additional circuitry below the indicated negative supply port. In one embodiment such circuitry comprises supply ports to additional amplifiers so the three or more amplifiers may be stacked according to the invention. In FIG. 1 the current $I_{A1,out}$ flowing out of the output supply port of the first amplifier (in use) is illustrated by an arrow 18 and the current $I_{A2,in}$ flowing into the input supply port of the second amplifier 7 is illustrated by the arrow 19. The signal $S_{A1,out}$ (often a voltage signal) is found on the output signal port 5 whereas the signal $S_{A2,out}$ is found on the port 10.

All or some of the elements 14-17 are not necessarily present. One or more of the elements may in principle be any electrical components active or passive. In one embodiment the elements 14-17 comprise one or more amplifiers. In one embodiment the elements comprise one or more amplifiers arranged along the same signal path. In one embodiment one or more amplifiers are arranged so the signal output of one amplifier is connected to the input supply port of the next, i.e. said amplifiers are arranged in series along the signal path. In one embodiment the supply ports of said amplifiers are arranged in parallel. In one embodiment such amplifiers correspond to cascaded amplifier which in at least some aspects may be considered as equivalent to a single amplifier. This may in one embodiment correspond to the element 14 being an amplifier arranged in series along the signal path with the first amplifier 3. Accordingly, in one embodiment the element 14 and the first amplifier 3 may be considered to be a single amplifier which may be referred to as "the first amplifier". The element 22 is in one embodiment not present meaning that element is replaced by a conductor. In one such embodiment a current source is either comprised in either of the amplifiers and/or one or more of the elements 14-17 is arranged to provide that the output supply current 18 and input supply current 19 are substantially independent. In one embodiment the element 22 functions substantially as current source so as to provide said independence.

Figure 2:
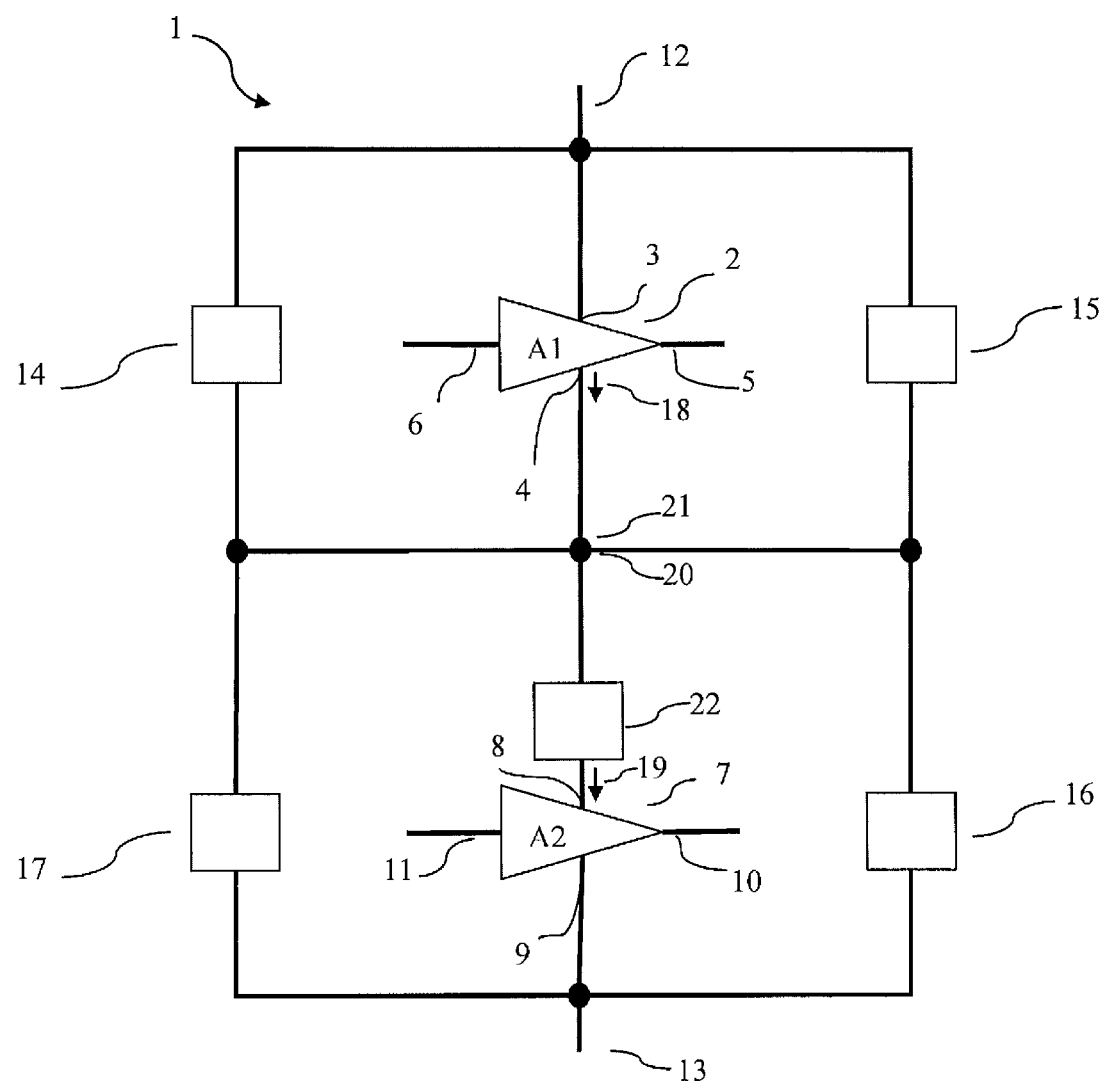
FIG. 2 shows an equivalent circuit to that of FIG. 1.

FIG. 2 shows a circuit equivalent to the circuit of FIG. 1.

Figure 3:
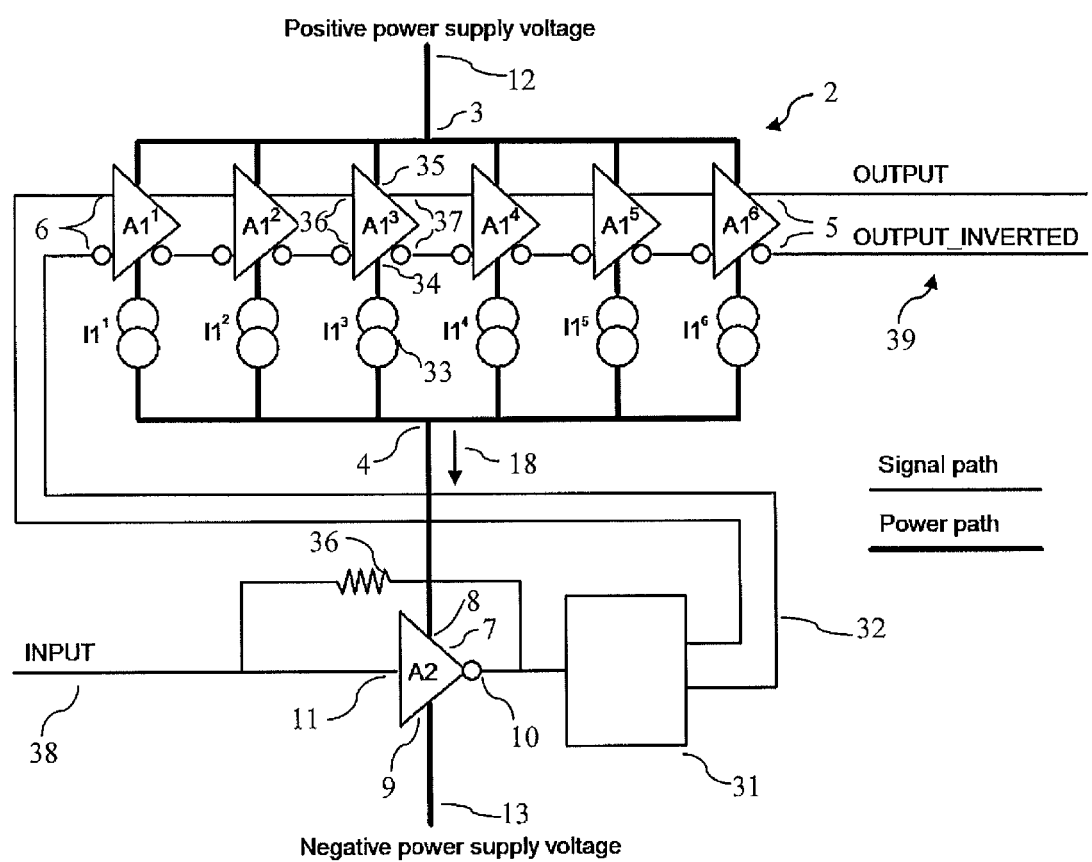
FIG. 3 shows a receiver circuit according to the invention.

The circuit of FIG. 3 is an exemplary receiver circuit according to the invention arranged to receive a single ended input from a photodiode. The second amplifier 7 is the first amplifier along the signal path and is arranged as a transimpedance amplifier with feedback via a transistor 36. The element 31 converts the single ended output of the second amplifier 7 to a differential signal. Conversion from single ended to differential has been discussed above. In one embodiment the element 31 may comprise two or more components active as well as passive. In one embodiment the element 31 is further connected to the output 39 of the receiver, such as to adjust the conversion so that a differential signal with a symmetric eye-diagram is obtained. The first amplifier 2 is formed by cascaded amplifiers $A1^1$-$A1^6$. In one embodiment the first amplifier is taken to be one or more of the amplifiers $A1^1$-$A1^6$ and the remaining amplifier(s) are taken to be an element such as corresponding to the elements 14 or 15. In one embodiment $A1^3$ is taken to be the first amplifier having an input supply port 35 and an output supply port 34. The input signal port 36 and the output signal port 37 both of which are differential. Depending on the choice of definition the current sources $I1^1$-$I1^6$ may be considered as individual components or to be a part of the amplifiers $A1^1$-$A1^6$. In one embodiment where the first amplifier is considered to be formed by the cascaded amplifiers $A1^1$-$A1^6$, the current sources $I1^1$-$I1^6$ are considered as a part of the first amplifier. In one embodiment where the first amplifier is considered to be formed by the cascaded amplifiers $A1^1$-$A1^6$, the current sources $I1^1$-$I1^6$ are considered equivalent to a current source of the sum of the current sources $I1^1$-$I1^6$ i.e. arranged to provide the current marked by the arrow 18. In one embodiment the current sources $I1^1$-$I1^6$ are arranged to supply sufficient current to drive the second amplifier 7.

Figure 4:
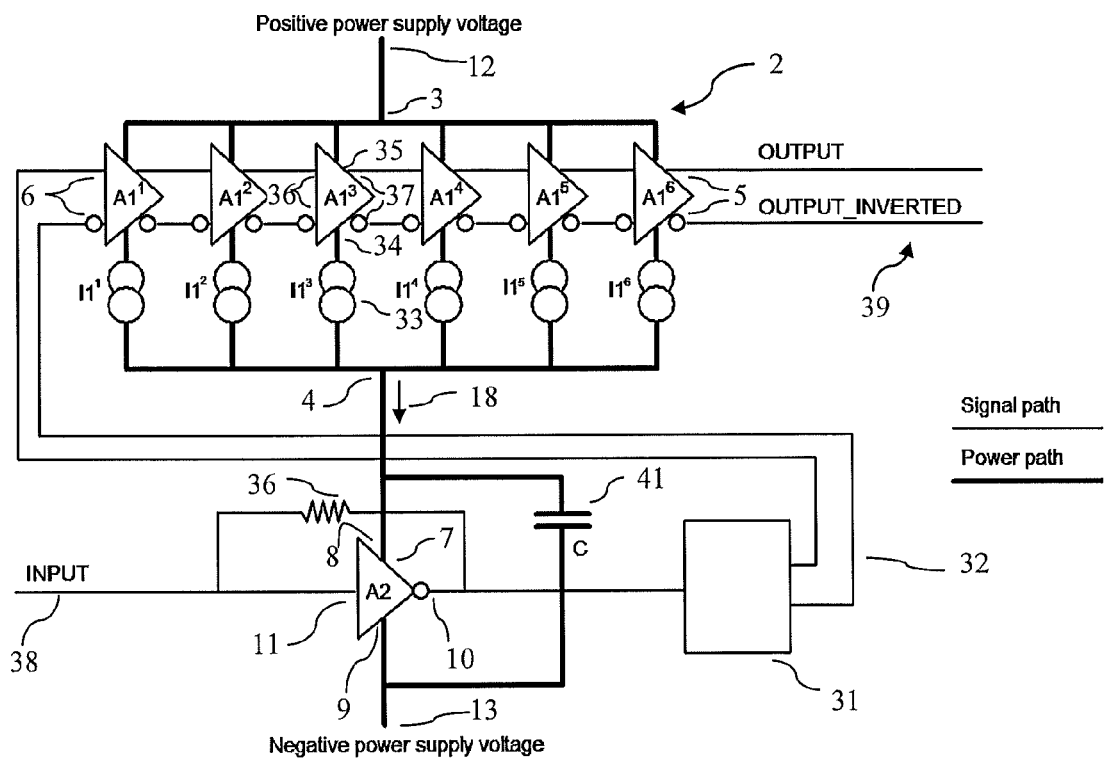
FIG. 4 shows a circuit similar to that of FIG. 3 with a capacitive load in parallel with the second amplifier.

FIG. 4 shows a similar receiver circuit to that of FIG. 3 but further comprises a capacitor 41 in parallel with the second amplifier 7. The capacitor functions as a voltage stabilizer to further shield the second amplifier from high frequency ripple in the current 18. In one embodiment the capacitor 41 is large relative to imperfections in the current sources $I1^1$-$I1^6$, such as parasitic capacitances. The capacitor may also shield the second amplifier from unexpected spike or the like which may occur e.g. during start-up.

Figure 5:
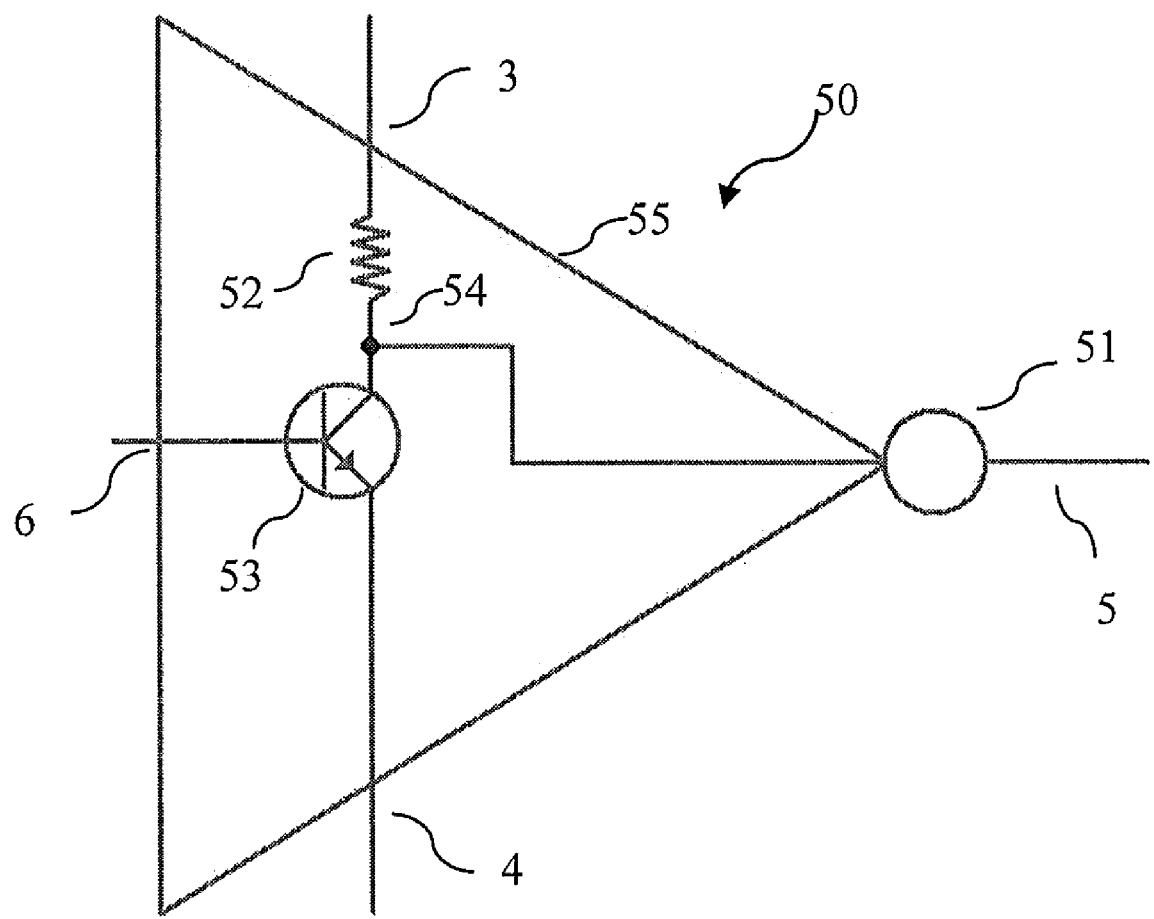
FIG. 5 shows an exemplary amplifier with a single ended input and output.

FIG. 5 shows an exemplary single ended amplifier 50. The triangle 55 indicates the extent of the amplifier, i.e. which components form the amplifier. The amplifier 50 consists of a transistor 53 and a resistor 52. The output 5 is taken from a node 54 and is inverted relative to the input port 6. This is indicated by the inversion symbol 51.

Figure 6:
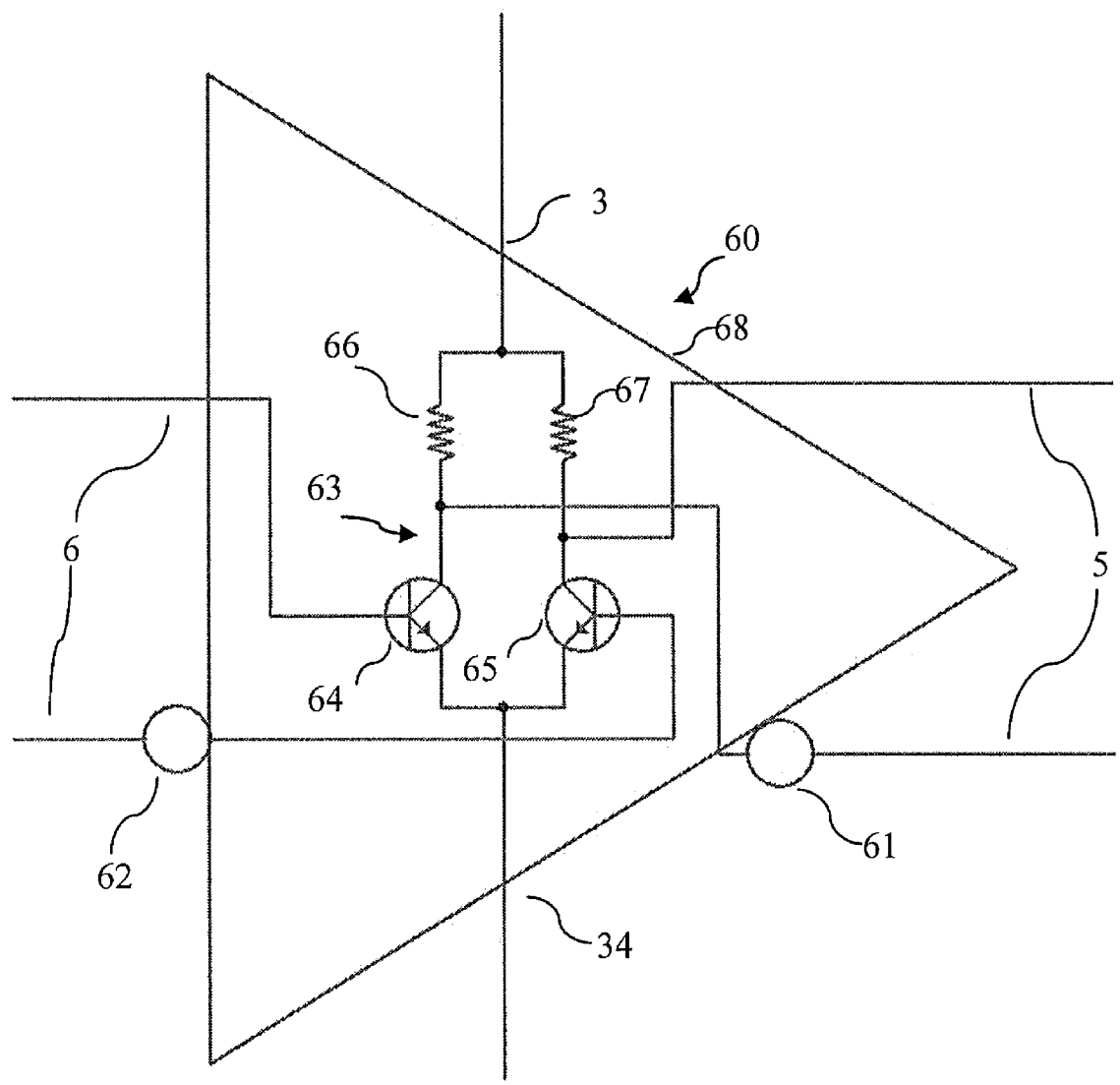
FIG. 6 shows an exemplary amplifier with a differential input and output.

FIG. 6 shows an exemplary differential amplifier 60. The triangle 68 indicates the extent of the amplifier, i.e. which components form the amplifier. The amplifier 60 consists of a differential pair 63 formed by the transistors 64 and 65. The amplifier further comprises the resistors 66 and 67.

Figure 7:
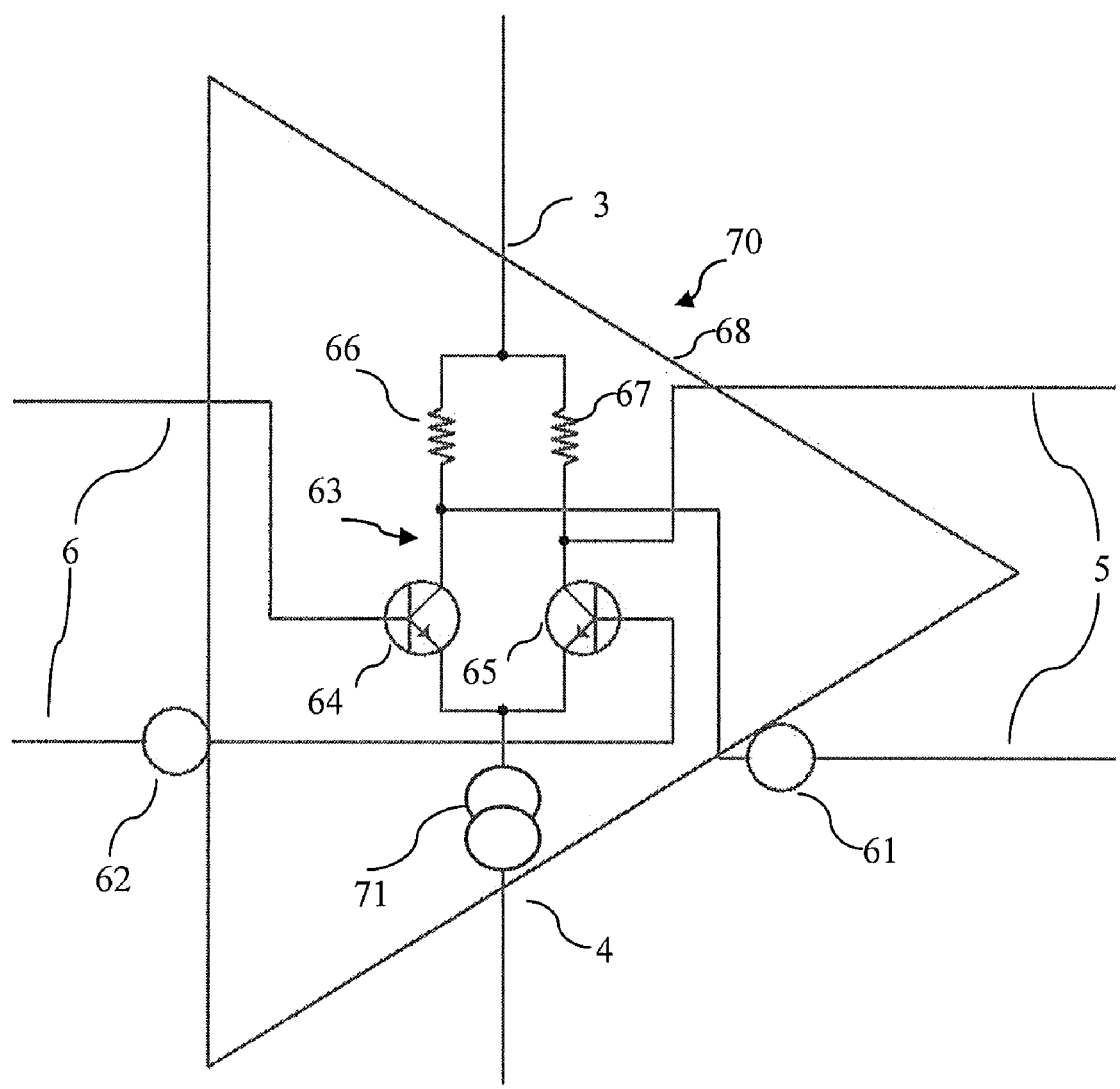
FIG. 7 shows an exemplary amplifier with a differential input and output where the amplifier further comprises a current source.

FIG. 7 shows an exemplary differential amplifier 70 similar to the amplifier shown in FIG. 6. In this case the amplifier further comprises a current source 71. However, such an amplifier may in some embodiment be equivalent to an amplifier 60 followed by a current source, such as e.g. the amplifiers $A1^1$ and $I1^1$ in FIG. 4. It may therefore be a matter of definition which components is a part of the amplifier. In one embodiment a component forms part of the amplifier when adjusting this component isolated with the remaining amplifier affects the gain of the amplifier. In another embodiment the amplifier is only considered to be formed by the transistors and resistors providing the gain, possibly as a function of the supplied current. As will be apparent to the skilled person, the amplifiers of FIGS. 5 to 7 are examples of common designs in the art which may be varied or replaced by other amplifier designs. One example is a transimpedance amplifier where the input supply port is connected to a current source.

Some preferred embodiments have been shown in the foregoing, but it should be stressed that the invention is not limited to these, but may be embodied in other ways within the subject-matter defined in the following claims.

The invention claimed is:

1. An integrated circuit having a signal input and a signal output, said integrated circuit comprising at least one first amplifier and at least one second amplifier, each comprising an input signal port, an output signal port, an input supply port and an output supply port, where the output supply port of said first amplifier is connected to the input supply port of said second amplifier via a current source, wherein said integrated circuit is arranged so that in use a current $I_{A1,out}$ flows out of the output supply port of said first amplifier, a current $I_{A2,in}$ flows into the input supply port of said second amplifier and a signal $S_{A1,out}$ is on the output signal port of the first amplifier wherein $I_{A2,in}$ comprises at least part of $I_{A1,out}$, and $I_{A2,in}$ is substantially independent of variations in $S_{A1,out}$.

2. The integrated circuit of claim 1 arranged so that when in use a signal $S_{A2,out}$ is on the output signal port of the second amplifier and $I_{A1,out}$ is substantially independent of variations in $S_{A2,out}$.

3. The integrated circuit of claim 1 wherein said first or said second amplifier comprises a substantially constant current source.

4. The integrated circuit of claim 1 wherein said supply connection comprises a substantially constant current source.

5. The integrated circuit of claim 1 arranged so that when in use $I_{A2,in}$ is substantially independent of variations in $I_{A1,out}$.

6. The integrated circuit of claim 1 wherein said signal inputs are arranged to receive a signal with a centre frequency $f_c$ wherein substantially independent is at least for frequencies less than $f_c/1000$.

7. The integrated circuit of claim 1 wherein substantially independent is at least for frequencies less 50 Hz.

8. The integrated circuit of claim 1 wherein the output signal port of the first amplifier is connected to the input signal port of the second amplifier via an electrical signal path or the output signal port of the second amplifier is connected to the input signal port of the first amplifier via an electrical signal path.

9. The integrated circuit of claim 1 wherein said first or said second amplifier has a differential input and/or output.

10. The integrated circuit of claim 1 wherein said signal output port of said first amplifier refers to the positive supply and said signal input port of said second amplifier refers to ground.

11. The integrated circuit of claim 1 arranged so that when in use $I_{A1,out}$ and $I_{A2,in}$ are substantially independent of supply voltage to the integrated circuit.

12. The integrated circuit of claim 1 wherein a voltage stabilizer is connected in parallel with said first and/or said second amplifier.

13. The integrated circuit of claim 1 wherein the output signal port of said first amplifier is connected to said input signal port of said second amplifier.

14. The integrated circuit of claim 1 wherein said second amplifier is configured as a transimpedance amplifier.

15. The integrated circuit of claim 1 wherein said first or second amplifier comprises a set of two or more cascaded amplifiers.

16. The integrated circuit of claim 1 wherein current supplied to said first amplifier is arranged to substantially match the current supplied to said second amplifier.

17. The integrated circuit of claim 1 wherein said integrated circuit is arranged to receive signals over a bandwidth larger than or equal to 10 GHz.

18. The integrated circuit of claim 1 wherein the term "substantially constant" is taken to mean substantially constant over a frequency span larger than or equal to 10 GHz.

19. The integrated circuit of claim 1 wherein said integrated circuit is suitable for amplifying a binary signals at a data-rate of 10 Gigabit/second or more.

20. The integrated circuit of claim 1 wherein said integrated circuit forms at least part of a receiver circuit suitable for receiving a signal from a photo detector.

21. The integrated circuit of claim 1 wherein said integrated circuit is a driver circuit suitable for driving a light emitter.

22. A system comprising
a circuit comprising an integrated circuit according to claims 1.

23. The system of claim 22 wherein said system is arranged to function with a single supply voltage.

24. The integrated circuit of claim 1 wherein the integrated circuit has high impedance into the output supply port of the first amplifier.

25. The integrated circuit of claim 1 wherein the integrated circuit is arranged so that during normal operation the integrated circuit has higher impedance into the output supply port of the first amplifier than the impedance out of the output supply port of the first amplifier where higher is a factor of 10 or higher.

26. The integrated circuit of claim 1 wherein at least one of said currents $I_{A1,out}$ and $I_{A2,in}$ are substantially determined by a resistor functioning substantially as a current source.

27. The integrated circuit of claim 24 wherein said impedance is measured at substantial DC.

28. The integrated circuit of claim 1 wherein said signal input port of said first amplifier refers to the positive supply and said signal output port of said second amplifier refers to ground.

29. The integrated circuit of claim 1 wherein said signal inputs are arranged to receive a signal with a center frequency $f_c$ wherein the term "substantially independent" is at least for frequencies from $f_c$ to substantially DC.

30. The system of claim 22 wherein said system is an optical receiver or transceiver and said circuit is connected to a photo detector.

31. The system of claim 22 wherein said system is an optical transmitter or transceiver and said circuit is connected to a light emitter.

* * * * *